(12) United States Patent  (10) Patent No.: US 12,369,429 B2
Ren et al.  (45) Date of Patent: Jul. 22, 2025

(54) ALL-BLACK CRYSTALLINE SILICON SOLAR CELL AND PREPARATION METHOD THEREFOR, AND PHOTOVOLTAIC MODULE

(71) Applicant: HENGDIAN GROUP DMEGC MAGNETICS CO., LTD, Dongyang (CN)

(72) Inventors: Yong Ren, Dongyang (CN); Yue He, Dongyang (CN); Hailiang Ren, Dongyang (CN); Shuai Guo, Dongyang (CN); Zhaochun Shi, Dongyang (CN); Lei Zhang, Dongyang (CN)

(73) Assignee: HENGDIAN GROUP DMEGC MAGNETICS CO., LTD, Dongyang (CN)

( * ) Notice: Subject to any disclaimer, the term of this patent is extended or adjusted under 35 U.S.C. 154(b) by 0 days.

(21) Appl. No.: 18/575,629

(22) PCT Filed: Feb. 22, 2023

(86) PCT No.: PCT/CN2023/077629
§ 371 (c)(1),
(2) Date: Dec. 29, 2023

(87) PCT Pub. No.: WO2023/226487
PCT Pub. Date: Nov. 30, 2023

(65) Prior Publication Data
US 2024/0304736 A1    Sep. 12, 2024

(30) Foreign Application Priority Data
May 23, 2022    (CN) .......................... 202210560944.9

(51) Int. Cl.
*H10F 77/30*    (2025.01)
*C23C 16/30*    (2006.01)
(Continued)

(52) U.S. Cl.
CPC ......... *H10F 77/315* (2025.01); *C23C 16/308* (2013.01); *C23C 16/345* (2013.01);
(Continued)

(58) Field of Classification Search
CPC ......... H01L 31/02168; H01L 31/02167; H01L 31/1868; H10F 77/315; H10F 19/00;
(Continued)

(56) References Cited

U.S. PATENT DOCUMENTS

2011/0303265 A1* 12/2011 Yuan ...................... H10F 10/14
257/E21.135
2012/0318347 A1* 12/2012 Junghanel ............. H10F 77/315
136/246
(Continued)

FOREIGN PATENT DOCUMENTS

CN    202513162 U    10/2012
CN    204497240 U    7/2015
(Continued)

OTHER PUBLICATIONS

International Search Report dated May 24, 2023 from corresponding PCT Application No. PCT/CN2023/077629.
(Continued)

*Primary Examiner* — Earl N Taylor
(74) *Attorney, Agent, or Firm* — ArentFox Schiff LLP

(57) ABSTRACT

Disclosed in the present invention are an all-black crystalline silicon solar cell and a preparation method therefor, and a photovoltaic module. The preparation method comprises the following steps: (1) depositing a film layer on the front face of a silicon wafer by means of a PECVD method so as to obtain a silicon wafer having a coated front face, wherein the film layer is of a laminated structure and comprises an innermost $SiN_x$ layer having a thickness of 20 nm or more; (2) subjecting the resulting silicon wafer having the coated
(Continued)

front face to back-face PECVD and laser beam grooving so as to obtain a coarse silicon solar cell; and (3) subjecting the resulting coarse silicon solar cell to silk-screen printing and electron injection to then obtain an all-black crystalline silicon solar cell. In the preparation method provided in the present application, the film layer is deposited on the front face of the silicon wafer by means of the PECVD method, the material and thickness of the innermost SiNx layer are designed, and particularly when the thickness thereof is 20 nm or more, the absorption and reflection effects of incident light on the surface of the cell are influenced, such that the incident light is almost completely absorbed, and only an extremely small amount of the incident light is reflected; therefore, the all-black crystalline silicon solar cell is obtained.

12 Claims, 1 Drawing Sheet

(51) Int. Cl.
    *C23C 16/34*         (2006.01)
    *C23C 16/40*         (2006.01)
    *C23C 16/455*       (2006.01)
    *H10F 19/00*         (2025.01)
    *H10F 71/00*         (2025.01)
    *H10F 77/20*         (2025.01)

(52) U.S. Cl.
    CPC ...... *C23C 16/401* (2013.01); *C23C 16/45523* (2013.01); *H10F 19/00* (2025.01); *H10F 71/1221* (2025.01); *H10F 71/129* (2025.01); *H10F 77/215* (2025.01)

(58) Field of Classification Search
    CPC .. H10F 71/1221; H10F 71/129; H10F 77/215; C23C 16/308; C23C 16/345; C23C 16/401; C23C 16/45523
    See application file for complete search history.

(56) References Cited

U.S. PATENT DOCUMENTS

| | | | | |
|---|---|---|---|---|
| 2014/0360567 A1* | 12/2014 | Seutter | ................. | H10F 19/908 420/548 |
| 2015/0027522 A1* | 1/2015 | Mueller | ................ | H10F 77/219 438/98 |
| 2022/0271179 A1* | 8/2022 | Li | ......................... | H10F 77/311 |
| 2023/0066259 A1* | 3/2023 | Yu | ......................... | H10F 77/311 |
| 2023/0071754 A1* | 3/2023 | Chai | ................... | H01L 21/0214 |
| 2023/0075790 A1* | 3/2023 | Jiao | ............................ | C03C 8/02 |
| 2024/0304736 A1* | 9/2024 | Ren | ................... | C23C 16/45523 |

FOREIGN PATENT DOCUMENTS

| | | | | |
|---|---|---|---|---|
| CN | 204991731 U | * | 1/2016 | |
| CN | 205452298 U | | 8/2016 | |
| CN | 108365023 A | * | 8/2018 | |
| CN | 208701204 U | | 4/2019 | |
| CN | 208753345 U | | 4/2019 | |
| CN | 110391304 A | | 10/2019 | |
| CN | 110581183 A | | 12/2019 | |
| CN | 110676347 A | | 1/2020 | |
| CN | 111081823 A | | 4/2020 | |
| CN | 111106186 A | | 5/2020 | |
| CN | 111146312 A | | 5/2020 | |
| CN | 211507647 U | * | 9/2020 | |
| CN | 112531035 A | | 3/2021 | |
| CN | 112652671 A | * | 4/2021 | |
| CN | 112652681 A | | 4/2021 | |
| CN | 214203702 U | | 9/2021 | |
| CN | 114944441 A | | 8/2022 | |
| JP | 2003197937 A | | 7/2003 | |
| JP | 2020506529 A | | 2/2020 | |
| JP | 6916972 B1 | * | 8/2021 | ....... H01L 31/02167 |

OTHER PUBLICATIONS

Office action dated Jul. 30, 2024 from corresponding Japanese Application No. 2024-502542.

\* cited by examiner

ALL-BLACK CRYSTALLINE SILICON SOLAR CELL AND PREPARATION METHOD THEREFOR, AND PHOTOVOLTAIC MODULE

CROSS REFERENCE TO RELATED APPLICATION(S)

This application is a National Stage application filed under 35 U.S.C. 371 based on International Patent Application No. PCT/CN2023/077629, filed on Feb. 22, 2023, which claims priority to Chinese Patent Application 202210560944.9, filed with the China National Intellectual Property Administration (CNIPA) on May 23, 2022, the disclosures of both of which are incorporated herein by reference in their entireties.

TECHNICAL FIELD

Examples of the present application relate to the field of cell technology, for example, a method for preparing an all-black crystalline silicon solar cell, and especially relate to an all-black crystalline silicon solar cell, a preparation method thereof and a photovoltaic module.

BACKGROUND

With the depletion of non-renewable energy and the increasing seriousness of global warming, it has become a consensus to establish an energy system mainly based on renewable energy to realize green and sustainable development. The renewable energy still has a low penetration rate and a broad development prospect, wherein the photovoltaic power generation has distinct economic advantages, its cost per kilowatt-hour has been lower than that of coal power, and will continue to decline in the future, and its development potential cannot be underestimated.

Solar energy is a clean energy source, the research and development about solar energy has stepped into a new stage, and people have begun to pay attention to the appearance of cell modules. All-black solar photovoltaic modules are widely accepted due to the consistency and aesthetics of their appearance.

To obtain all-black modules, on the one hand, the fitting materials can employ black busbars, coated glass or other auxiliary means; on the other hand, the key cell materials needs to be well controlled at the cell manufacturing, which is critical to black modules. How to obtain the ideal black cell in the manufacturing process of the crystalline silicon solar cell is the key to technological improvement.

CN204497240U discloses a passivated anti-reflection multilayer film design for a crystalline silicon high-efficiency black cell, which mainly comprises the following content: a bottom layer of the passivated anti-reflection multilayer film is a $SiO_x$ layer with a refractive index of 1.48-1.8 and a thickness of 2-20 nm; a middle layer of the passivated anti-reflection multilayer film is a $SiN_x$ layer, which can be a single layer of $SiN_x$ or multiple layers of $SiN_x$ with different refractive indexes, and a refractive index range is 1.90-2.20 and a thickness is 30-70 nm; a top layer of the passivated anti-reflection multilayer film is a $SiO_xN_y$ layer with a refractive index of 1.6-1.95 and a thickness of 20-60 nm; the passivated anti-reflection multilayer film has a total film thickness of 80-140 μm and a refractive index of 1.9-2.1. The multilayer passivated anti-reflection film of high-efficiency black solar cell can not only reduce the interface state of the cell surface and improve the passivation effect, but also reduce the reflectivity of the cell surface and improve the short-circuit current, and also have a good anti-PID attenuation characteristic at the same time. The color of the prepared black cell is dark and uniform without color difference after lamination.

CN205452298U discloses a new photovoltaic black module, which mainly comprises the following content: a glass plate, an upper encapsulating material, a solar cell plate, a lower encapsulating material, a back plate and a frame enclosing on the edges of the glass and back plate, which are arranged in sequence from top to bottom, and the back plate and the frame are black, the surface of the solar cell plate has a silicon nitride film with a refractive index of 2.0-2.2 and a thickness of 60-90 nm, and the anti-reflective film on the surface of the glass plate has a thickness of 100-180 nm. The design principle of the utility model patent is that the thickness and refractive index of the silicon nitride film on the surface of the cell plat are matched with the photovoltaic glass and the glass coating layer, and when the coated glass and the silicon nitride film layer are well matched, the appearance of the module can show a uniform color effect. The module of the utility model patent can meet the strict requirements of color difference in the application, and meanwhile, this module not only can achieve a high power, but also can save the time cost of manual color sorting, greatly improving work efficiency.

CN208753345U discloses an all-black BIPV module, which, from top to bottom, sequentially comprises: a front glass, wherein pattern blocks are arranged on the front side of the front glass in an array; a transparent PVB adhesive film, which is used for front encapsulation; a cell module, which is used for the conversion from solar energy to electrical energy; a black PVB adhesive film, which is used for back encapsulation; and a back glass, wherein the front and back sides of the back glass are frosted. The all-black BIPV module in the utility model patent can effectively prevent glare by using the front glass with pattern blocks arranged on the front side, and the use of black PVB adhesive film on the back side can not only match the color of the surrounding buildings, but also effectively absorb light, so that the module can reduce glare. The front and back sides of the back glass are frosted to reduce glare at all angles.

Although the above technical solutions improve the black degree of the solar cell, the limitation of the refractive index in CN204497240U has an obvious defect that the refractive index of 1.9-2.20 is too small. Meanwhile, for the outer layer, only the silicon oxynitride layer is limited, while others such as the SiO layer is not involved; only the PECVD coating process is involved, without extending to other processes. CN205452298U and CN208753345U only focus on the improvement of modules without involving improvements of the cell.

Therefore, it is an urgent problem to be solved in the technical field of solar cells to provide a method to improve the all-black appearance of solar cells.

SUMMARY

The following is a summary of the subject described herein. This summary is not intended to limit the protection scope of the claims.

An example of the present application provides an all-black crystalline silicon solar cell, a preparation method thereof and a photovoltaic module. A film layer is deposited on the front surface of a silicon wafer by the PECVD method, and the material and thickness of the innermost SiN$_x$ layer are designed, and especially when the thickness is more than or equal to 20 nm, the absorption and reflection effect of the incident light on the surface of the cell are affected, and almost all of the incident light is absorbed while only a very small amount is reflected, and thus an all-black crystalline silicon solar cell is obtained.

Examples of the present application adopt the following technical solutions.

In a first aspect, a method for preparing an all-black crystalline silicon solar cell is provided, and the preparation method comprises the following steps:
(1) depositing a film layer on the front surface of a silicon wafer by a PECVD method to obtain a front-coated silicon wafer; the film layer is a layered structure, the film layer comprises an innermost SiN$_x$ layer with a thickness of more than or equal to 20 nm;
(2) subjecting the obtained front-coated silicon wafer to back PECVD and laser grooving to obtain a crude silicon solar cell; and
(3) subjecting the obtained crude silicon solar cell to screen printing and current injection to obtain the all-black crystalline silicon solar cell.

In the preparation method of the present application, a film layer is deposited on the front surface of a silicon wafer by the PECVD method, and the material and thickness of the innermost SiN$_x$ layer are designed, and especially, when the thickness is more than or equal to 20 nm, the absorption and reflection effect of the incident light on the surface of the cell are affected, and almost all of the incident light is absorbed while only a very small amount is reflected, and thus an all-black crystalline silicon solar cell is obtained.

In the preparation method of the present application, the thickness of the innermost SiN$_x$ layer is a key factor to control the black appearance of the cell, and when the thickness is thicker and more than or equal to 20 nm, the laminated cell module has a good black effect.

Preferably, the film layer in step (1) comprises the innermost SiN$_x$ layer, an intermediate SiN$_x$ layer, a SiO$_x$N$_y$ layer and a SiO$_x$ layer which are stacked from inside to outside.

Preferably, an outermost layer of the film layer in step (1) comprises a SiO$_x$ layer.

Preferably, the innermost SiN$_x$ layer has a thickness of 20-50 nm, which may be, for example, 20 nm, 25 nm, 30 nm, 40 nm, 45 nm or 50 nm; however, the thickness is not limited to the listed values, and other unlisted values within this value range are also applicable.

Preferably, the innermost SiN$_x$ layer has a refractive index of more than or equal to 2.3, which may be, for example, 2.3, 2.4, 2.5, 2.6, 2.7 or 2.8; however, the refractive index is not limited to the listed values, and other unlisted values within this value range are also applicable; preferably, the refractive index is 2.3-3.4.

The refractive index of the innermost SiN$_x$ layer in the present application influences the cell conversion efficiency, and the refractive index of the innermost SiN$_x$ layer being more than or equal to 2.3 ensures that the solar cell has high conversion performance while having the all-black appearance.

Preferably, the SiO$_x$ layer has a thickness of more than or equal to 20 nm, which may be, for example, 20 nm, 25 nm, 30 nm, 40 nm, 50 nm or 60 nm; however, the thickness is not limited to the listed values, and other unlisted values within this value range are also applicable; preferably, the thickness is 20-40 nm.

Preferably, the SiO$_x$ layer has a refractive index of 1.45-1.55, which may be, for example, 1.45, 1.47, 1.49, 1.51, 1.53 or 1.55; however, the refractive index is not limited to the listed values, and other unlisted values within this value range are also applicable.

The SiO$_x$ layer provided by the present application is close to the glass interface layer and has a low refractive index, and the refractive index of 1.45-1.55 is basically close to the refractive index of the glass, which is conducive to the direct incidence and absorption of light without generating refraction and reflection, greatly increasing the absorption of light, so that the cell visually appears black.

Preferably, the deposition in step (1) comprises the following steps:
(a) after vacuuming, pre-introducing silane and ammonia gas at a constant pressure;
(b) depositing an innermost SiN$_x$ layer on the front surface of a silicon wafer;
(c) depositing an intermediate SiN$_x$ layer on the innermost SiN$_x$ layer, and depositing a SiO$_x$N$_y$ layer on the intermediate SiN$_x$ layer;
(d) after vacuuming, pre-introducing silane and laughing gas at a constant pressure; and
(e) depositing a SiO$_x$ layer on the SiO$_x$N$_y$ layer.

Preferably, the constant pressure in step (a) is 200-250 Pa, which may be, for example, 200 Pa, 210 Pa, 220 Pa, 230 Pa, 240 Pa or 250 Pa; however, the pressure is not limited to the listed values, and other unlisted values within this value range are also applicable.

Preferably, the pre-introduction in step (a) is performed for 15-30 s, which may be, for example, 15 s, 18 s, 20 s, 22 s, 25 s, 28 s or 30 s; however, the period is not limited to the listed values, and other unlisted values within this value range are also applicable.

Preferably, the silane pre-introduced in step (a) has a flow rate of 2200-2500 sccm, which may be, for example, 2200 sccm, 2250 sccm, 2300 sccm, 2400 sccm, 2450 sccm or 2500 sccm; however, the flow rate is not limited to the listed values, and other unlisted values within this value range are also applicable.

Preferably, the ammonia gas pre-introduced in step (a) has a flow rate of 9000-9300 sccm, which may be, for example, 9000 sccm, 9050 sccm, 9100 sccm, 9200 sccm or 9300 sccm; however, the flow rate is not limited to the listed values, and other unlisted values within this value range are also applicable.

Preferably, the pre-introduction in step (a) is performed at 400-600° C., which may be, for example, 400° C., 450° C., 500° C., 550° C. or 600° C.; however, the temperature is not limited to the listed values, and other unlisted values within this value range are also applicable.

Preferably, the deposition in step (b) is performed for 60-80 s, which may be, for example, 60 s, 65 s, 70 s, 75 s or 80 s; however, the period is not limited to the listed values, and other unlisted values within this value range are also applicable.

Preferably, the deposition in step (b) is performed at 400-600° C., which may be, for example, 400° C., 450° C., 500° C., 550° C. or 600° C.; however, the temperature is not limited to the listed values, and other unlisted values within this value range are also applicable.

Preferably, the deposition in step (b) is performed at 200-250 Pa, which may be, for example, 200 Pa, 210 Pa, 220 Pa, 230 Pa, 240 Pa or 250 Pa; however, the pressure is not limited to the listed values, and other unlisted values within this value range are also applicable.

Preferably, silane and ammonia gas are introduced during the deposition in step (b).

Preferably, the silane introduced has a flow rate of 2200-2500 sccm, which may be, for example, 2200 sccm, 2250 sccm, 2300 sccm, 2350 sccm, 2400 sccm, 2450 sccm or 2500 sccm; however, the flow rate is not limited to the listed values, and other unlisted values within this value range are also applicable.

Preferably, the ammonia gas introduced has a flow rate of 9000-9300 sccm, which may be, for example, 9000 sccm, 9050 sccm, 9100 sccm, 9200 sccm or 9300 sccm; however, the flow rate is not limited to the listed values, and other unlisted values within this value range are also applicable.

Preferably, the deposition in step (b) is performed at a radio frequency power of 14000-16000 W, which may be, for example, 14000 W, 14500 W, 15000 W, 15500 W or 16000 W; however, the radio frequency power is not limited to the listed values, and other unlisted values within this value range are also applicable.

Preferably, the deposition in step (b) is performed at a pulse switching ratio of (3-5)/(50-70), which may be, for example, 3/50, 4/60, 5/70, 3/70 or 5/50; however, the pulse switching ratio is not limited to the listed values, and other unlisted values within this value range are also applicable.

Preferably, the constant pressure in step (d) is 150-200 Pa, which may be, for example, 150 Pa, 180 Pa, 200 Pa, 210 Pa, 220 Pa, 230 Pa, 240 Pa or 250 Pa; however, the pressure is not limited to the listed values, and other unlisted values within this value range are also applicable.

Preferably, the pre-introduction in step (d) is performed for 5-15 s, which may be, for example, 5 s, 8 s, 10 s, 12 s or 15 s; however, the period is not limited to the listed values, and other unlisted values within this value range are also applicable.

Preferably, the silane pre-introduced in step (d) has a flow rate of 600-700 sccm, which may be, for example, 600 sccm, 620 sccm, 640 sccm, 660 sccm, 680 sccm or 700 sccm; however, the flow rate is not limited to the listed values, and other unlisted values within this value range are also applicable.

Preferably, the laughing gas pre-introduced in step (d) has a flow rate of 10000-12000 sccm, which may be, for example, 10000 sccm, 10500 sccm, 11000 sccm, 11500 sccm or 12000 sccm; however, the flow rate is not limited to the listed values, and other unlisted values within this value range are also applicable.

Preferably, the pre-introduction in step (d) is performed at 400-600° C., which may be, for example, 400° C., 450° C., 500° C., 550° C. or 600° C.; however, the temperature is not limited to the listed values, and other unlisted values within this value range are also applicable.

Preferably, the deposition in step (e) is performed for 150-200 s, which may be, for example, 150 s, 160 s, 170 s, 180 s, 190 s or 200 s; however, the period is not limited to the listed values, and other unlisted values within this value range are also applicable.

Preferably, the deposition in step (e) is performed at 400-600° C., which may be, for example, 400° C., 450° C., 500° C., 550° C. or 600° C.; however, the temperature is not limited to the listed values, and other unlisted values within this value range are also applicable.

Preferably, the deposition in step (e) is performed at 100-150 Pa, which may be, for example, 150 Pa, 180 Pa, 200 Pa, 210 Pa, 220 Pa, 230 Pa, 240 Pa or 250 Pa; however, the pressure is not limited to the listed values, and other unlisted values within this value range are also applicable.

Preferably, silane and laughing gas are introduced during the deposition in step (e).

Preferably, the silane introduced has a flow rate of 600-700 sccm, which may be, for example, 600 sccm, 620 sccm, 640 sccm, 660 sccm, 680 sccm or 700 sccm; however, the flow rate is not limited to the listed values, and other unlisted values within this value range are also applicable.

Preferably, the laughing gas introduced has a flow rate of 10000-12000 sccm, which may be, for example, 10000 sccm, 10500 sccm, 11000 sccm, 11500 sccm or 12000 sccm; however, the flow rate is not limited to the listed values, and other unlisted values within this value range are also applicable.

Preferably, the deposition in step (e) is performed at a radio frequency power of 14000-16000 W, which may be, for example, 14000 W, 14500 W, 15000 W, 15500 W or 16000 W; however, the radio frequency power is not limited to the listed values, and other unlisted values within this value range are also applicable.

Preferably, the deposition in step (e) is performed at a pulse switching ratio of (1-3)/(30-50), which may be, for example, 1/30, 2/40, 3/50, 1/50 or 3/30; however, the pulse switching ratio is not limited to the listed values, and other unlisted values within this value range are also applicable.

Preferably, the screen printing in step (3) is performed by a gradient linewidth screen.

Preferably, a linewidth of the gradient linewidth screen is reduced in a gradient manner from outside to inside.

Preferably, the linewidth of the gradient linewidth screen is reduced by at most 1 μm every 5 mm or less from an outer edge to inside.

The interval of 5 mm or less may be, for example, 1 mm, 2 mm, 3 mm, 4 mm or 5 mm; however, the interval is not limited to the listed values, and other unlisted values within this value range are also applicable.

The reduction of at most 1 μm may be, for example, 0.2 μm, 0.4 μm, 0.6 μm, 0.8 μm or 1 μm; however, the reduced value is not limited to the listed values, and other unlisted values within this value range are also applicable.

Preferably, the gradient linewidth screen has an accuracy of ±1 μm, which may be, for example, ±0.1 μm, ±0.2 μm, ±0.5 μm, ±0.8 μm or ±1 μm; however, the accuracy is not limited to the listed values, and other unlisted values within this value range are also applicable.

As a preferred technical solution provided in the present application, from an edge of the gradient linewidth screen starts to inside, in 12-15 mm, the linewidth is reduced by 0.5-1 μm every 4-5 mm, and a linewidth at a starting position is 19-21 μm.

In the related technologies, the linewidth of the screen is inconsistent with the actual linewidth of the cell in the printing process, affecting the visual color of the laminated cell module. Narrower linewidth gives more black appearance, and wider linewidth gives more gray appearance. Meanwhile, because of the wrap around, i.e., the back coating film is deposited on the front side, the edges of the cell are blue.

In the present application, by designing the gradient linewidth screen with a special linewidth configuration and widening the edges of the screen, the blue effect is concealed, while a black effect is visually formed after lamination, and the problem that edges of the cell are blue caused by the wrap around during the back PECVD in step (2) is solved, so that the color of the solar cell is visually all black.

Preferably, a method of the screen printing in step (3) comprises: after loading and grooving the wafer, performing a first printing and drying, performing a second printing and drying, performing a third printing and drying, performing a fourth printing and drying, sintering, and testing linewidths of the cell to complete the screen printing.

Preferably, the fourth printing is performed with a gradient linewidth screen under pressure.

Preferably, a linewidth of the gradient linewidth screen is reduced in a gradient manner from outside to inside. The term "from outside to inside" refers to a reduction gradient from an outermost edge of the gradient linewidth screen to inside.

Preferably, a linewidth of the gradient linewidth screen is reduced by at most 1 μm every 5 mm or less from an outer edge to inside.

The interval of 5 mm or less may be, for example, 1 mm, 2 mm, 3 mm, 4 mm or 5 mm; however, the interval is not limited to the listed values, and other unlisted values within this value range are also applicable.

The reduction of at most 1 μm may be, for example, 0.2 μm, 0.4 μm, 0.6 μm, 0.8 μm or 1 μm; however, the reduced value is not limited to the listed values, and other unlisted values within this value range are also applicable.

Preferably, a difference between the linewidths of the cell tested is of less than or equal to 5 μm, which may be, for example, 1 μm, 2 μm, 3 μm, 4 μm or 5 μm; however, the difference is not limited to the listed values, and other unlisted values within this value range are also applicable.

When the difference of the linewidths among the cells is more than 5 μm, the whole cell module is prone to obvious color leap, affecting the visual black effect.

In a second aspect, an example of the present application provides an all-black crystalline silicon solar cell, and the all-black crystalline silicon solar cell is prepared by the method according to the first aspect.

In a third aspect, an example of the present application provides a photovoltaic module, and the photovoltaic module comprises the all-black crystalline silicon solar cell according to the second aspect.

In view of the above technical solutions, the beneficial effects of the examples of the present application are as follows.

(1) In the preparation method provided by the examples of the present application, the film layer is deposited on the front surface of a silicon wafer by the PECVD method, and the material and thickness of the innermost $SiN_x$ layer are designed, and especially when the thickness is more than or equal to 20 nm, the absorption and reflection effect of the incident light on the surface of the cell are affected, and almost all of the incident light is absorbed while only a very small amount is reflected, and thus the all-black crystalline silicon solar cell with a good overall visual black effect is obtained.

(2) In addition to the all-black appearance, the solar cell also has high conversion performance.

(3) In the examples of the present application, by designing the gradient linewidth screen with a special linewidth configuration and adjusting the printing process, the problem that edges of the cell are blue caused by the wrap around easily appearing in the back PECVD is solved, so that the color of the solar cell is visually all black, the appearance is uniform without color difference, and the consistency is good.

Other aspects can be understood upon reading and appreciating the accompanying drawings and detailed description.

BRIEF DESCRIPTION OF DRAWINGS

Accompanying drawings are used to provide a further understanding of the technical solutions herein and form part of the specification. The accompanying drawings are used in conjunction with examples of the present application to explain the technical solutions herein, and do not limit the technical solutions herein.

Reference list: 1—silicon wafer, 2—innermost $SiN_x$ layer, 3—intermediate $SiN_x$ layer, 4—$SiO_xN_y$ layer, and 5—$SiO_x$ layer.

DETAILED DESCRIPTION

The technical solutions of the present application are further described below with reference to embodiments and drawings. However, the following examples are only simple examples of the present application, and do not represent or limit the protection scope of the claims of the present application, and the protection scope of the present application is defined by the claims.

Example 1

Figure 1:
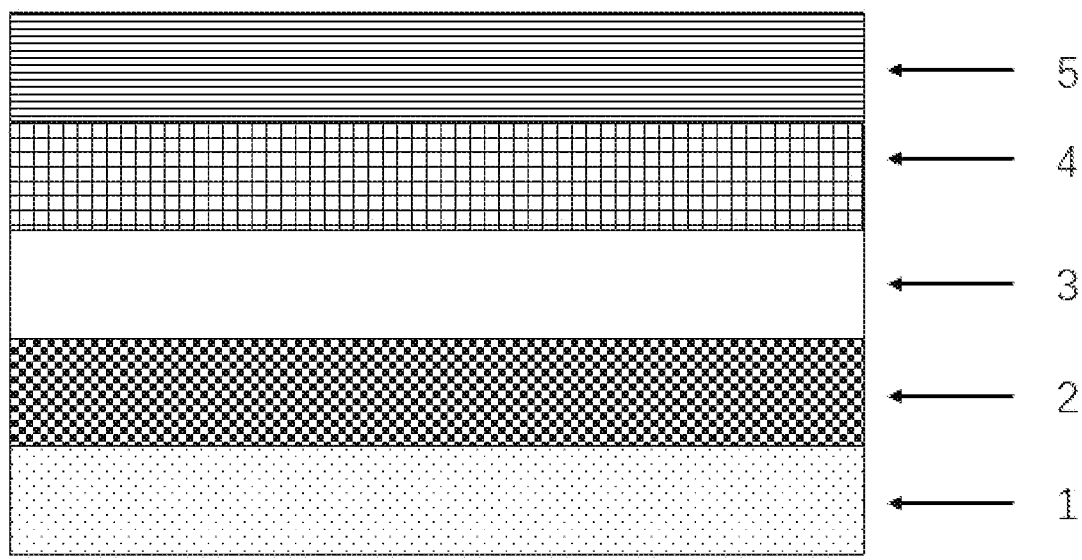
FIG. 1 is a structural schematic diagram of a film layer provided in step (1) of Examples 1, 2, and 3 of the present application.
Figure 2:
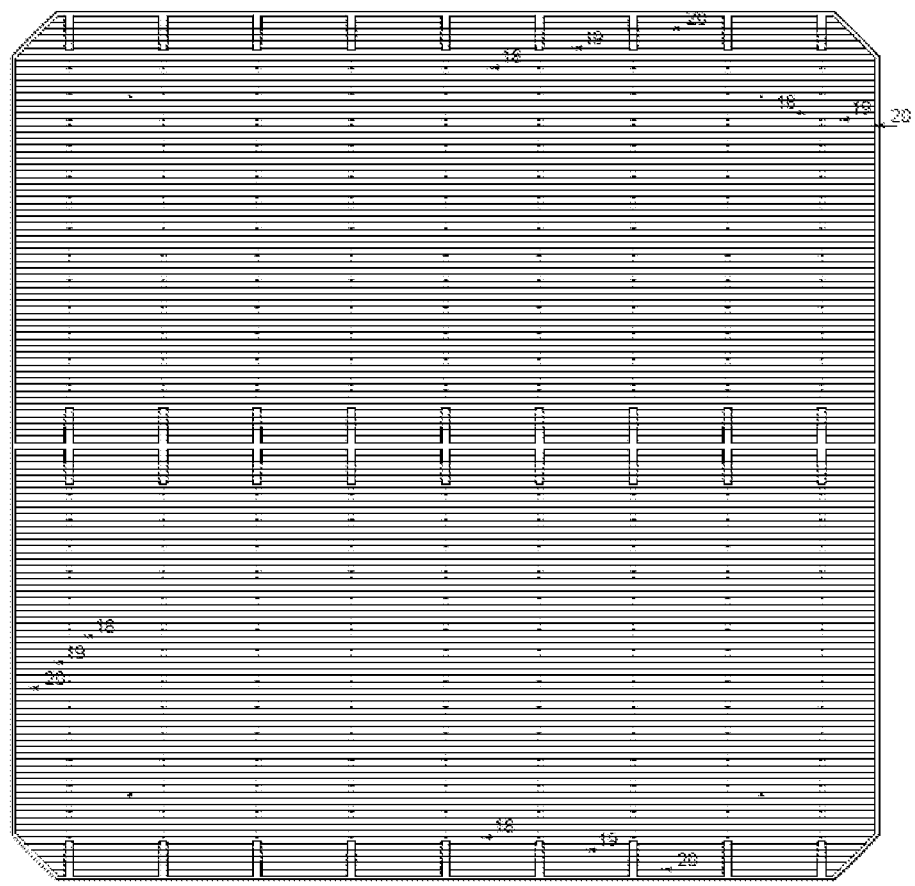
FIG. 2 is a structural schematic diagram of a gradient linewidth screen provided in Example 1.

This example provides a method for preparing an all-black crystalline silicon solar cell, and the method comprises the following steps:

(1) a film layer (FIG. 1) was deposited on the front surface of a silicon wafer 1 (Longi silicon wafer with a resistivity of 0.4-1.1, a thickness of 160 μm and a size of 166 mm) by a PECVD method, the film layer was a layered structure, and a front-coated silicon wafer was obtained; and the film layer comprised an innermost $SiN_x$ layer 2, an intermediate $SiN_x$ layer 3, a $SiO_xN_y$ layer 4 and a $SiO_x$ layer 5 which were stacked from inside to outside; the innermost $SiN_x$ layer 2 had a thickness of 20 nm and a refractive index of 2.3; the $SiO_x$ layer 5 was the outermost layer, and had a thickness of 20 nm and a refractive index of 1.5;

the deposition of the film layer in step (1) comprises the following steps:

(a) after vacuuming, silane and ammonia gas were pre-introduced for 20 s at a constant pressure of 230 Pa, where the silane had a flow rate of 2316 sccm, and the ammonia gas had a flow rate of 9276 sccm, and a temperature was 500° C.;

(b) an innermost $SiN_x$ layer 2 was deposited on the front surface of the silicon wafer 1, where a deposition period was 70 s, a temperature was 500° C., a constant pressure was 240 Pa, the silane had a flow rate of 2316 sccm, the ammonia gas had a flow rate of 9276 sccm, a radio frequency power was 14500 W, and a pulse switching ratio was 4/60;

(c) an intermediate $SiN_x$ layer 3 was deposited on the innermost $SiN_x$ layer 2, and a $SiO_xN_y$ layer 4 was deposited on the intermediate $SiN_x$ layer 3;

(d) after vacuuming, silane and laughing gas was pre-introduced for 10 s at a constant pressure of 180 Pa and a temperature of 500° C., where the silane had a flow rate of 686 sccm, and the laughing gas had a flow rate of 10990 sccm; and (e) a $SiO_x$ layer 5 was deposited on the $SiO_xN_y$ layer 4, where a period was 190 s, a temperature was 500° C., a constant pressure was 130 Pa, the silane had a flow rate of 686 sccm, and the laughing gas had a flow rate of 10990 sccm, a radio frequency power was 14500 W, and a pulse switching ratio was 2/38;
(2) the obtained front-coated silicon wafer was subjected to back PECVD and laser grooving, and a crude silicon solar cell was obtained; and
(3) the obtained crude silicon solar cell was subjected to screen printing and current injection, and then the all-black crystalline silicon solar cell was obtained;
a method of the screen printing comprises: after loading and grooving the wafer, the crude silicon solar cell was subjected to a first printing and drying, a second printing and drying, a third printing and drying, and a fourth printing by using a gradient linewidth screen and drying, and sintering, a linewidth of the cell was tested, and then the screen printing was completed;
within 15 mm from an edge of the gradient linewidth screen (FIG. 2) to inside, the linewidth was reduced by 1 μm every 5 mm, and a linewidth at the starting position was 20 μm and "18", "19", and "20" of FIG. 2 represent the linewidths of the marked lines with a unit of μm.

Example 2

This example provides a method for preparing an all-black crystalline silicon solar cell, and the method comprises the following steps:
(1) a film layer (FIG. 1) was deposited on the front surface of a silicon wafer 1 by a PECVD method, the film layer was a layered structure, and a front-coated silicon wafer was obtained; the film layer comprised an innermost $SiN_x$ layer 2, an intermediate $SiN_x$ layer 3, a $SiO_xN_y$ layer 4 and a $SiO_x$ layer 5 which were stacked from inside to outside; the innermost $SiN_x$ layer 2 had a thickness of 22 nm and a refractive index of 2.5; the $SiO_x$ layer 5 was the outermost layer, and had a thickness of 22 nm and a refractive index of 1.45;
the deposition of the film layer in step (1) comprises the following steps:
(a) after vacuuming, silane and ammonia gas were pre-introduced for 30 s at a constant pressure of 250 Pa, where the silane had a flow rate of 2200 sccm, and the ammonia gas had a flow rate of 9300 sccm, a temperature was 400° C.;
(b) an innermost $SiN_x$ layer 2 was deposited on the front surface of the silicon wafer 1, where a deposition period was 80 s, a temperature was 400° C., a constant pressure was 250 Pa, the silane had a flow rate of 2500 sccm, the ammonia gas had a flow rate of 9300 sccm, a radio frequency power was 16000 W, and a pulse switching ratio was 3/70;
(c) an intermediate $SiN_x$ layer 3 was deposited on the innermost $SiN_x$ layer 2, and a $SiO_xN_y$ layer 4 was deposited on the intermediate $SiN_x$ layer 3;
(d) after vacuuming, silane and laughing gas was pre-introduced for 15 s at a constant pressure of 200 Pa and a temperature of 400° C., where the silane had a flow rate of 700 sccm, and the laughing gas had a flow rate of 12000 sccm; and
(e) a $SiO_x$ layer 5 was deposited on the $SiO_xN_y$ layer 4, where a period was 200 s, a temperature was 400° C., a constant pressure was 150 Pa, the silane had a flow rate of 700 sccm, and the laughing gas had a flow rate of 12000 sccm, a radio frequency power was 16000 W, and a pulse switching ratio was 1/50;

(2) the obtained front-coated silicon wafer was subjected to back PECVD and laser grooving, and a crude silicon solar cell was obtained; and
(3) the obtained crude silicon solar cell was subjected to screen printing and current injection, and then the all-black crystalline silicon solar cell was obtained;
a method of the screen printing comprises: after loading and grooving the wafer, the crude silicon solar cell was subjected to a first printing and drying, a second printing and drying, a third printing and drying, and a fourth printing by using a gradient linewidth screen and drying, and sintering, and a linewidth of the cell was tested, and then the screen printing was completed;
within 12 mm from an edge of the gradient linewidth screen to inside, the linewidth was reduced by 0.5 μm every 4 mm, and a linewidth at the starting position was 21 μm.

Example 3

This example provides a method for preparing an all-black crystalline silicon solar cell, and the method comprises the following steps:
(1) a film layer (FIG. 1) was deposited on the front surface of a silicon wafer 1 by a PECVD method, the film layer was a layered structure, and a front-coated silicon wafer was obtained; and the film layer comprised an innermost $SiN_x$ layer 2, an intermediate $SiN_x$ layer 3, a $SiO_xN_y$ layer 4 and a $SiO_x$ layer 5 which were stacked from inside to outside; the innermost $SiN_x$ layer 2 had a thickness of 28 nm and a refractive index of 2.5; the $SiO_x$ layer 5 was the outermost layer, and had a thickness of 25 nm and a refractive index of 1.55;
the deposition of the film layer in step (1) comprises the following steps:
(a) after vacuuming, silane and ammonia gas were pre-introduced for 15 s at a constant pressure of 200 Pa, where the silane had a flow rate of 2200 sccm, the ammonia gas had a flow rate of 9000 sccm, and a temperature was 400° C.;
(b) an innermost $SiN_x$ layer 2 was deposited on the front surface of the silicon wafer 1, where a deposition period was 60 s, a temperature was 600° C., a constant pressure was 200 Pa, the silane had a flow rate of 2200 sccm, the ammonia gas had a flow rate of 9000 sccm, a radio frequency power was 14000 W, and a pulse switching ratio was 5/70;
(c) an intermediate $SiN_x$ layer 3 was deposited on the innermost $SiN_x$ layer 2, and a $SiO_xN_y$ layer 4 was deposited on the intermediate $SiN_x$ layer 3;
(d) after vacuuming, silane and laughing gas was pre-introduced for 15 s at a constant pressure of 150 Pa and a temperature of 400° C., where the silane had a flow rate of 600 sccm, and the laughing gas had a flow rate of 10000 sccm; and
(e) a $SiO_x$ layer 5 was deposited on the $SiO_xN_y$ layer 4, where a period was 190 s, a temperature was 500° C., a constant pressure was 130 Pa, the silane had a flow rate of 600 sccm, and the laughing gas had a flow rate of 10000 sccm, a radio frequency power was 14000 W, and a pulse switching ratio was 1/30;
(2) the obtained front-coated silicon wafer was subjected to back PECVD and laser grooving, and a crude silicon solar cell was obtained; and
(3) the obtained crude silicon solar cell was subjected to screen printing and current injection, and then the all-black crystalline silicon solar cell was obtained;

a method of the screen printing comprises: after loading and grooving the wafer, the crude silicon solar cell was subjected to a first printing and drying, a second printing and drying, a third printing and drying, and a fourth printing by using a gradient linewidth screen and drying, and sintering, and the linewidth of the cell was tested, and then the screen printing was completed; within 15 mm from an edge of the gradient linewidth screen to inside, the linewidth was reduced by 1 μm every 5 mm, and a linewidth at the starting position was 19 μm.

Example 4

This example provides a method for preparing an all-black crystalline silicon solar cell, and this example is the same as Example 1 except that the innermost $SiN_x$ layer had a refractive index of 2.

Example 5

This example provides a method for preparing an all-black crystalline silicon solar cell, and this example is the same as Example 1 except that the $SiO_x$ layer had a refractive index of 1.3.

Example 6

This example provides a method for preparing an all-black crystalline silicon solar cell, and this example is the same as Example 1 except that the $SiO_x$ layer had a refractive index of 1.6.

Example 7

This example provides a method for preparing an all-black crystalline silicon solar cell, and this example is the same as Example 1 except that in step (3), the gradient linewidth screen was replaced with a conventional screen.

Example 8

This example provides a method for preparing an all-black crystalline silicon solar cell, and this example is the same as Example 1 except that the innermost $SiN_x$ layer had a thickness of 55 nm.

Example 9

This example provides a method for preparing an all-black crystalline silicon solar cell, and this example is the same as Example 1 except that the $SiO_x$ layer had a thickness of 15 nm.

Example 10

This example provides a method for preparing an all-black crystalline silicon solar cell, and this example is the same as Example 1 except that the $SiO_x$ layer had a thickness of 45 nm.

Comparative Example 1

This comparative example provides a method for preparing an all-black crystalline silicon solar cell, and this example is the same as Example 1 except that the innermost $SiN_x$ layer had a thickness of 15 nm.

Comparative Example 2

This comparative example provides a method for preparing a silicon solar cell, and this method is obtained according to CN204497240U.

The solar cells obtained by the above preparation methods were tested and detected, and the results are shown in Table 1.

TABLE 1

| Test Number | Conversion Efficiency | Appearance (Black Level) |
| --- | --- | --- |
| Example 1 | 23.28% | 100% |
| Example 2 | 23.30% | 100% |
| Example 3 | 23.29% | 100% |
| Example 4 | 23.31% | 85% |
| Example 5 | 23.30% | 80% |
| Example 6 | 23.31% | 80% |
| Example 7 | 23.32% | 60% |
| Example 8 | 23.00% | 95% |
| Example 9 | 23.27% | 75% |
| Example 10 | 23.15% | 85% |
| Comparative Example 1 | 23.33% | 70% |
| Comparative Example 2 | 23.20% | 50% |

The following conclusions can be obtained from Table 1.

(1) As can be seen from Examples 1-3, the preparation method provided in the present application affects the absorption and reflection effect of the incident light on the surface of the cell, so that almost all of the incident light is absorbed while only a very small amount is reflected, and thus an all-black crystalline silicon solar cell is obtained; meanwhile, the all-black crystalline silicon solar cell also has high conversion performance.

(2) From the comparison of Example 4 with Example 1, when the refractive index of the innermost $SiN_x$ layer is less than 2.3, the prepared all-black crystalline silicon solar cell has a poor black effect.

(3) From the comparison of Examples 5 and 6 with Example 1, when the refractive index of the $SiO_x$ layer is not within the range of 1.45-1.55 provided in the present application, the prepared all-black crystalline silicon solar cell has a poor black effect.

(4) From the comparison of Example 7 with Example 1, when the gradient linewidth screen provided in the present application is not used, the edges of the prepared all-black crystalline silicon solar cell are blue.

(5) From the comparison of Example 8 with Example 1, when the thickness of the innermost $SiN_x$ layer is more than 55 nm, the prepared all-black crystalline silicon solar cell has a poor black effect.

(6) From the comparison of Examples 9 and 10 with Example 1, when the thickness of the $SiO_x$ layer is not within the range of 20-40 nm, the prepared all-black crystalline silicon solar cell has a poor black effect.

(7) From the comparison of Comparative Example 1 with Example 1, when the thickness of the innermost $SiN_x$ layer is not within the range provided in the present application, i.e., the thickness of the innermost $SiN_x$ layer is less than 20 nm, the prepared all-black crystalline silicon solar cell has a poor black effect.

(8) From the comparison of Comparative Example 2 with Example 1, the present application improves the black effect and conversion efficiency of the all-black crystalline silicon solar cell over the related technologies.

The detailed structural features of the present application are illustrated by the above examples. However, the present application is not limited to the above structural features, that is, the present application is not necessarily rely on the above detailed structural features to be implemented. Those skilled in the art should understand that any improvement of the present application, the equivalent replacement of the components selected in the present application, the addition of auxiliary components and the choice of specific methods all fall within the protection and disclosure scope of the present application.

What is claimed is:

1. A method for preparing an all-black crystalline silicon solar cell, comprising the following steps:
   (1) depositing a film layer on a front surface of a silicon wafer by a PECVD method to obtain a front-coated silicon wafer, where the film layer is a layered structure, and the film layer comprises an innermost $SiN_x$ layer with a thickness of 25-50 nm and the innermost $SiN_x$ layer has a refractive index of 2.8-3.4;
   (2) subjecting the front-coated silicon wafer to back PECVD and laser grooving to obtain a crude silicon solar cell; and
   (3) subjecting the crude silicon solar cell to screen printing and current injection to obtain the all-black crystalline silicon solar cell,
   a method of the screen printing comprises: after the grooving, subjecting the crude silicon solar cell to a first printing and drying, a second printing and drying, a third printing and drying, a fourth printing and drying, sintering, and testing linewidths of the cell to complete the screen printing, the fourth printing is performed with a gradient linewidth screen under pressure, and a linewidth of the gradient linewidth screen is reduced in a gradient manner from outside to inside, wherein a difference between the linewidths of the cell tested is less than or equal to 5 μm.

2. The method for preparing an all-black crystalline silicon solar cell according to claim 1, wherein the film layer in step (1) comprises the innermost $SiN_x$ layer, an intermediate $SiN_x$ layer, a $SiO_xN_y$ layer and a $SiO_x$ layer which are stacked from inside to outside.

3. The method for preparing an all-black crystalline silicon solar cell according to claim 1, wherein an outermost layer of the film layer in step (1) comprises a $SiO_x$ layer.

4. The method for preparing an all-black crystalline silicon solar cell according to claim 3, wherein the $SiO_x$ layer has a refractive index of 1.45-1.55.

5. The method for preparing an all-black crystalline silicon solar cell according to claim 2, wherein the $SiO_x$ layer has a thickness of more than or equal to 20 nm.

6. The method for preparing an all-black crystalline silicon solar cell according to claim 1, wherein the depositing in step (1) comprises the following steps:
   (a) vacuuming, then pre-introducing silane and ammonia gas at a constant pressure;
   (b) depositing the innermost $SiN_x$ layer on the front surface of the silicon wafer;
   (c) depositing an intermediate $SiN_x$ layer on the innermost $SiN_x$ layer, and depositing a $SiO_xN_y$ layer on the intermediate $SiN_x$ layer;
   (d) vacuuming, then pre-introducing silane and laughing gas at a constant pressure; and
   (e) depositing a $SiO_x$ layer on the $SiO_xN_y$ layer.

7. The method for preparing an all-black crystalline silicon solar cell according to claim 6, wherein the constant pressure in step (a) is 200-250 Pa;
   the pre-introducing in step (a) is performed for 15-30 s;
   the pre-introducing silane in step (a) has a flow rate of 2200-2500 sccm;
   the pre-introducing ammonia gas in step (a) has a flow rate of 9000-9300 sccm;
   the pre-introducing in step (a) is performed at 400-600° C.;
   the depositing in step (b) is performed for 60-80 s;
   the depositing in step (b) is performed at 400-600° C.;
   the depositing in step (b) is performed at 200-250 Pa;
   silane and ammonia gas are introduced during the depositing in step (b);
   the silane introduced has a flow rate of 2200-2500 sccm;
   the ammonia gas introduced has a flow rate of 9000-9300 sccm;
   the depositing in step (b) is performed at a radio frequency power of 14000-16000 W;
   the depositing in step (b) is performed at a pulse switching ratio of (3 to 5)/(50 to 70).

8. The method for preparing an all-black crystalline silicon solar cell according to claim 6, wherein the constant pressure in step (d) is 150-200 Pa;
   the pre-introducing in step (d) is performed for 5-15 s;
   the pre-introducing silane in step (d) has a flow rate of 600-700 sccm;
   the pre-introducing laughing gas in step (d) has a flow rate of 10000-12000 sccm;
   the pre-introducing in step (d) is performed at 400-600° C.

9. The method for preparing an all-black crystalline silicon solar cell according to claim 6, wherein the depositing in step (e) is performed for 150-200 s;
   the depositing in step (e) is performed at 400-600° C.;
   the depositing in step (e) is performed at 100-150 Pa;
   silane and laughing gas are introduced during the depositing in step (e);
   the silane introduced has a flow rate of 600-700 sccm;
   the laughing gas introduced has a flow rate of 10000-12000 sccm;
   the depositing in step (e) is performed at a radio frequency power of 14000-16000 W;
   the depositing in step (e) is performed at a pulse switching ratio of (1 to 3)/(30 to 50).

10. The method for preparing an all-black crystalline silicon solar cell according to claim 1, wherein the linewidth of the gradient linewidth screen is reduced by at most 1 μm but more than 0 μm every 5 mm or less but more than 0 mm from an outer edge to inside.

11. The method for preparing an all-black crystalline silicon solar cell according to claim 2, wherein the $SiO_x$ layer has a thickness of 20-40 nm.

12. The method for preparing an all-black crystalline silicon solar cell according to claim 2, wherein the $SiO_x$ layer has a refractive index of 1.45-1.55.

* * * * *